United States Patent
Kim et al.

(10) Patent No.: US 8,638,150 B2
(45) Date of Patent: Jan. 28, 2014

(54) METHOD AND SYSTEM FOR COMPENSATING MODE CONVERSION OVER A COMMUNICATIONS CHANNEL

(75) Inventors: Andrew Joo Kim, Suwanee, GA (US); Gwilym Luff, Great Shelford (GB)

(73) Assignee: Intersil Americas LLC, Milpitas, CA (US)

( * ) Notice: Subject to any disclaimer, the term of this patent is extended or adjusted under 35 U.S.C. 154(b) by 0 days.

(21) Appl. No.: 13/606,609

(22) Filed: Sep. 7, 2012

(65) Prior Publication Data

US 2013/0154704 A1    Jun. 20, 2013

Related U.S. Application Data

(60) Provisional application No. 61/577,716, filed on Dec. 20, 2011, provisional application No. 61/622,668, filed on Apr. 11, 2012, provisional application No. 61/665,577, filed on Jun. 28, 2012.

(51) Int. Cl.
*H03K 5/12* (2006.01)

(52) U.S. Cl.
USPC ............ 327/170; 327/318; 327/355; 375/220

(58) Field of Classification Search
USPC ......... 327/170, 308, 317–319, 355, 361–362; 326/30, 82, 86, 90; 375/220, 254
See application file for complete search history.

(56) References Cited

U.S. PATENT DOCUMENTS

| | | | |
|---|---|---|---|
| 6,329,843 B1 * | 12/2001 | Hirata et al. | 326/82 |
| 6,417,687 B1 * | 7/2002 | Heinrich | 326/21 |
| 6,573,764 B1 * | 6/2003 | Taylor | 327/108 |
| 6,646,482 B2 * | 11/2003 | Takeuchi | 327/112 |
| 2009/0121761 A1 | 5/2009 | Fung et al. | |

* cited by examiner

*Primary Examiner* — An Luu
(74) *Attorney, Agent, or Firm* — King & Spalding

(57) ABSTRACT

A circuit can compensate for intra pair skew or mode conversion in a channel by applying a second or corrective mode conversion effect that counters the channel's mode conversion. The circuit can process the common mode signal with a frequency dependent filter prior to injection back into the differential mode. The circuit can implement the reverse mode conversion with passive circuits using integrated resistors and metal oxide semiconductor (MOS) switches. In certain embodiments, such actions can proceed effectively without necessarily consuming active power.

20 Claims, 10 Drawing Sheets

Conventional Differential Receiver

METHOD AND SYSTEM FOR COMPENSATING MODE CONVERSION OVER A COMMUNICATIONS CHANNEL

CROSS REFERENCE TO RELATED APPLICATIONS

This patent application claims priority to: U.S. Provisional Patent Application No. 61/577,716, entitled "Intra Pair Skew and Mode Conversion Compensator" and filed Dec. 20, 2011 in the name of Andrew Kim and Gwilym Luff; U.S. Provisional Patent Application No. 61/622,668, entitled "Intra Pair Skew and Mode Conversion Compensator" and filed Apr. 11, 2012 in the name of Andrew Kim and Gwilym Luff; and U.S. Provisional Patent Application No. 61/665,577, entitled "Method and System for Compensating Mode Conversion Over a Communications Channel" and filed Jun. 28, 2012 in the name of Andrew Kim and Gwilym Luff. The entire contents of each of the three provisional patent applications identified above are hereby incorporated herein by reference.

Figure 1:
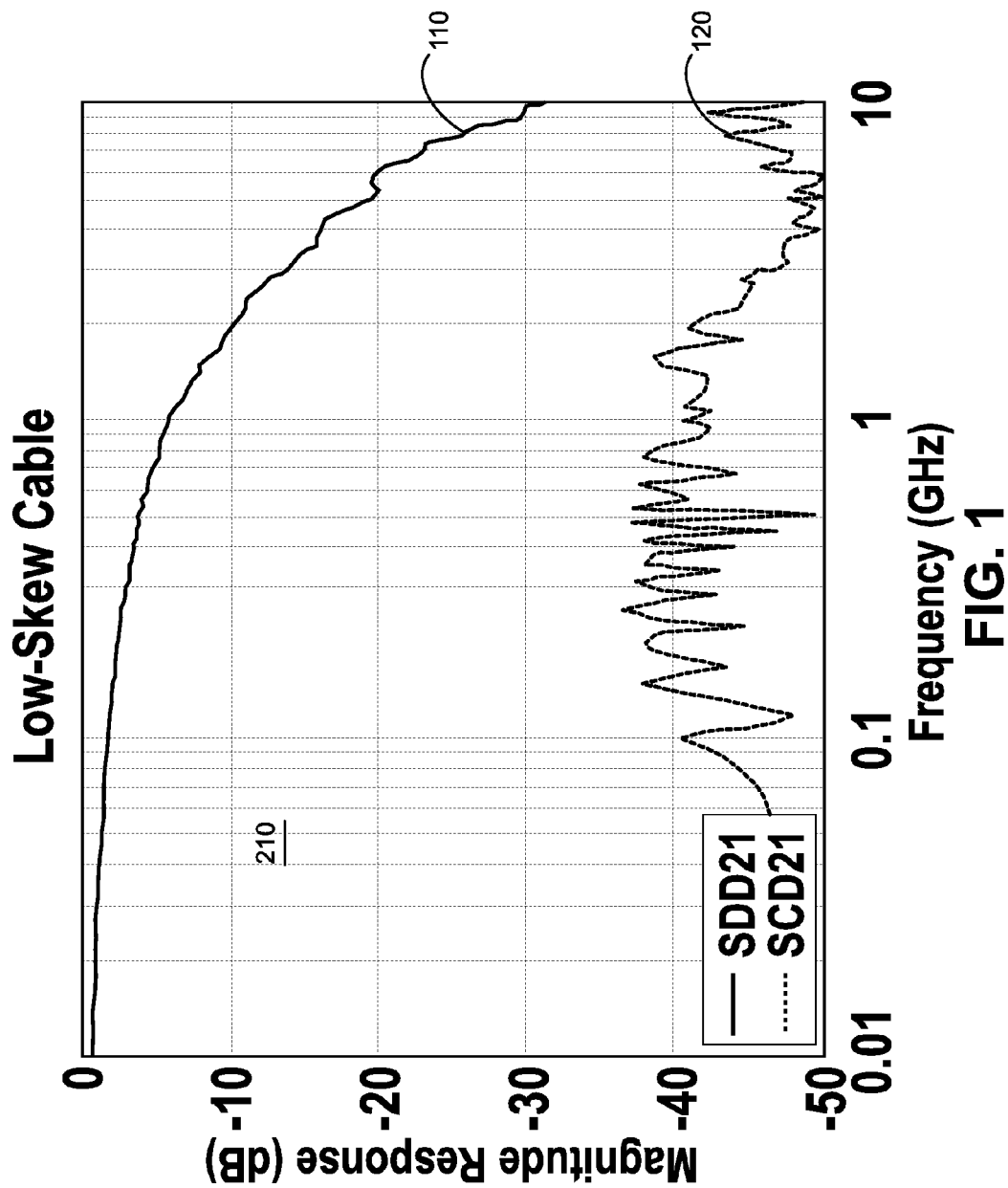
FIG. 1 illustrates a plot of S-parameters of a 'good' (low skew) cable, showing the desirable effect of a channel with negligible mode conversion as exhibited by the strong SDD21 response relative to the SCD21 response.

Many aspects of the technology can be better understood with reference to the above drawings. The drawings illustrate only exemplary embodiments of the technology and are therefore not to be considered limiting of its scope, as the invention may admit to other equally effective embodiments. The elements and features shown in the drawings are not necessarily to scale, emphasis instead being placed upon clearly illustrating the principles of exemplary embodiments of the present invention. Additionally, certain dimensions may be exaggerated to help visually convey such principles. In the drawings, reference numerals designate like or corresponding, but not necessarily identical, elements.

DETAILED DESCRIPTION OF EXEMPLARY EMBODIMENTS

Mode conversion and intra-pair skew in a differential channel can impair high speed differential signal communication by severely distorting the SDD21 S-parameter response of the channel. In extreme cases of mode conversion and skew, these distortions can be so extreme that even with sophisticated equalization, the data is still unrecoverable in the presence of noise. Consequently, the conventional art has resorted to restricting the amount of mode conversion or skew that a compliant channel can exhibit, but unfortunately, this results in higher production costs associated with the tighter manufacturing tolerances and/or lower yield after screening. The present technology can alleviate such costs by allowing lower grade channels to be used with receiver or transmitter based circuitry that can compensate channels exhibiting severe amounts of skew or mode conversion by deliberating performing a second mode conversion which is operative to counter the mode conversion or skew incurred over the channel.

Differential signaling is a technique for signal communication involving the transmission of a signal and its complement over two electrical conductors. This technique is useful for serial data transfer, especially when the data rates exceed 100 Mb/s. Printed circuit board (PCB) traces and differential cables (e.g. twisted pair, twin-axial, and pairs of co-axial cables) are examples of channels that can carry differential signals. Such channels can exhibit considerable frequency dependent dispersion for correction by an equalizer. The channel loss may vary as a function of signal frequency, and an equalizer can compensate this loss with a complementary frequency-dependent gain or loss. FIG. 1 shows the SDD21 110 and SCD21 120 components of the measured scattering parameters (commonly referred to as S-parameters) from a 'good' channel that is often desired for high-speed communications. As is known in the art, the SDD21 response conveys how much of a differentially transmitted signal is received in the differential mode when communicated over a channel. It is generally desired for this signal to be as close to 0 dB (or magnitude 1 on a linear scale) as possible, regardless of frequency. The SCD21 response conveys how much of a differentially transmitted signal is received in the common mode when communicated over a channel. It is generally desired for this signal to be as close to minus infinity on a decibel scale (or 0 on a linear scale) as possible. In other words, it is desired to preserve as much of the differentially transmitted signal in the differential mode rather than have it convert into the common mode over the channel.

Equalization methods such as continuous time linear equalizers (CTLEs) or pole-zero equalizers, finite impulse response (FIR) filters, and decision feedback equalizers (DFEs) can compensate certain degradations on differential cables and traces, with various advantages and disadvantages.

Figure 2:
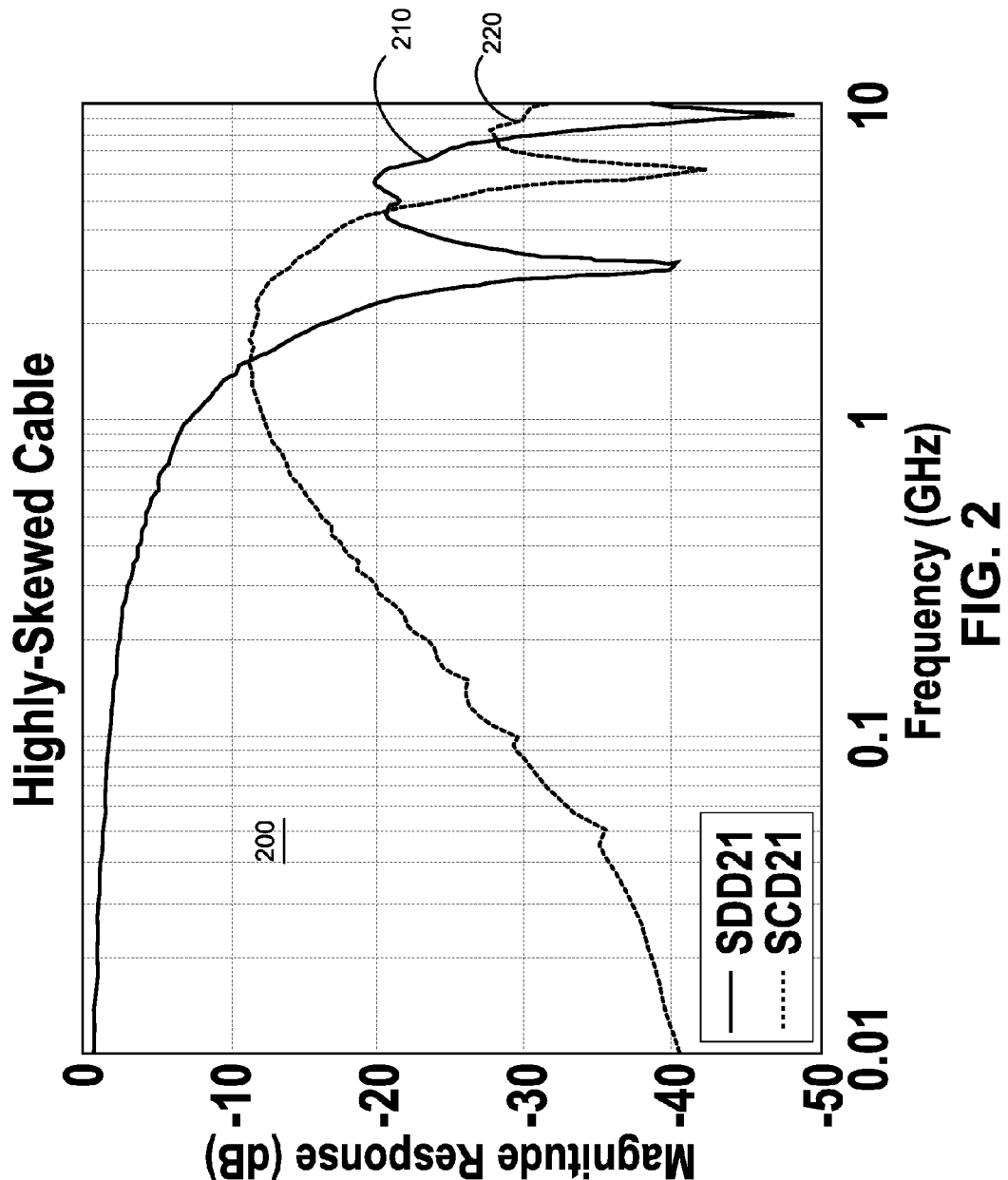
FIG. 2 illustrates a plot of S parameters of a 'bad' (severely skewed) cable obtained by introducing a delay on one of the two electrical conductors for the cable in FIG. 1 to model skew.

However, a channel characteristic for which conventional equalizers often fail to provide adequate compensation is severe intra pair skew or mode conversion. Channels with severe skew or mode conversion can exhibit extreme and unpredictable frequency dependent losses, such as deep notches in an associated transfer function. Compare, for example, the SDD21 210 and SCD21 220 S-parameter responses of the 'bad' channel in FIG. 2 to those (110 and 120) of the 'good' channel in FIG. 1. Typical conventional differential receivers and equalizers utilize only the differential signal component and discard the common mode component. Consequently, the differential signal loss in skewed or mode converted channels can be so severe as to preclude recovery with a filter of reasonable complexity and power consumption. Even in the absence of such complexity or power limit, the losses can be so severe that electrical noise (e.g. thermal noise or interference from outside sources) may drown out the attenuated signal to the point where it is unrecoverable. For these reasons, it is a generally accepted principle that extreme skew and mode conversion (as illustrated in FIG. 2) cannot be properly compensated utilizing conventional technology.

The conventional remedy entails attempting to manage the problem during the production of the cable (or circuit board traces or other physical channel) via either screening or more precise manufacturing methods to limit the amount of skew or mode conversion as noted in the VESA Display Port PHY Compliance Test Standard (Version 1, Revision 2, Nov. 1, 2010) and the Maxim Application Note AN4218 "*Unbalanced Twisted Pairs Can Give You the Jitters*" by Olisar published Dec. 15, 2008. Unfortunately, such remedies increase production cost of the cables.

Certain embodiments of present technology can utilize low power circuits to correct for issues such as intra pair skew and mode conversion. The correction facilitates utilizing lower tolerance, lower cost cables and printed circuit board (PCB) routing for high speed communications. Because embodiments of this technology cost far less than precision cable manufacturing and screening, the end user can achieve significant capital expenditure reduction. Furthermore, because the present technology supports compact, very low power CTLEs for equalization, the resulting energy savings presents an operational expenditure savings.

The conventional thinking is believed to be sound in that conventional equalization (i.e. frequency dependent amplification of the differential signal) is generally ineffective in compensating severely skewed or mode converted channels. However, the extrapolation that skew and mode conversion cannot be compensated is incorrect.

An insight to compensating skew relates to a realization that mode conversion does not necessarily result in loss of the differential signal's energy. Rather the energy has typically been converted into the common mode signal. Thus, the original differential signal can be recovered by performing a second mode conversion step, wherein the present technology counters the channel's skew or mode conversion by transforming part of the common mode signal energy back into the differential mode.

Certain exemplary embodiments of the present technology can: 1) compensate for intra pair skew or mode conversion in a channel by applying a second or corrective mode conversion effect that counters the channel's mode conversion; 2) process the common mode signal with a frequency dependent filter prior to injecting it back into the differential mode; and/or 3) implement the reverse mode conversion with passive circuits using integrated resistors and metal oxide semiconductor (MOS) switches. In certain embodiments, these actions can proceed effectively without necessarily consuming active power.

Figure 3:
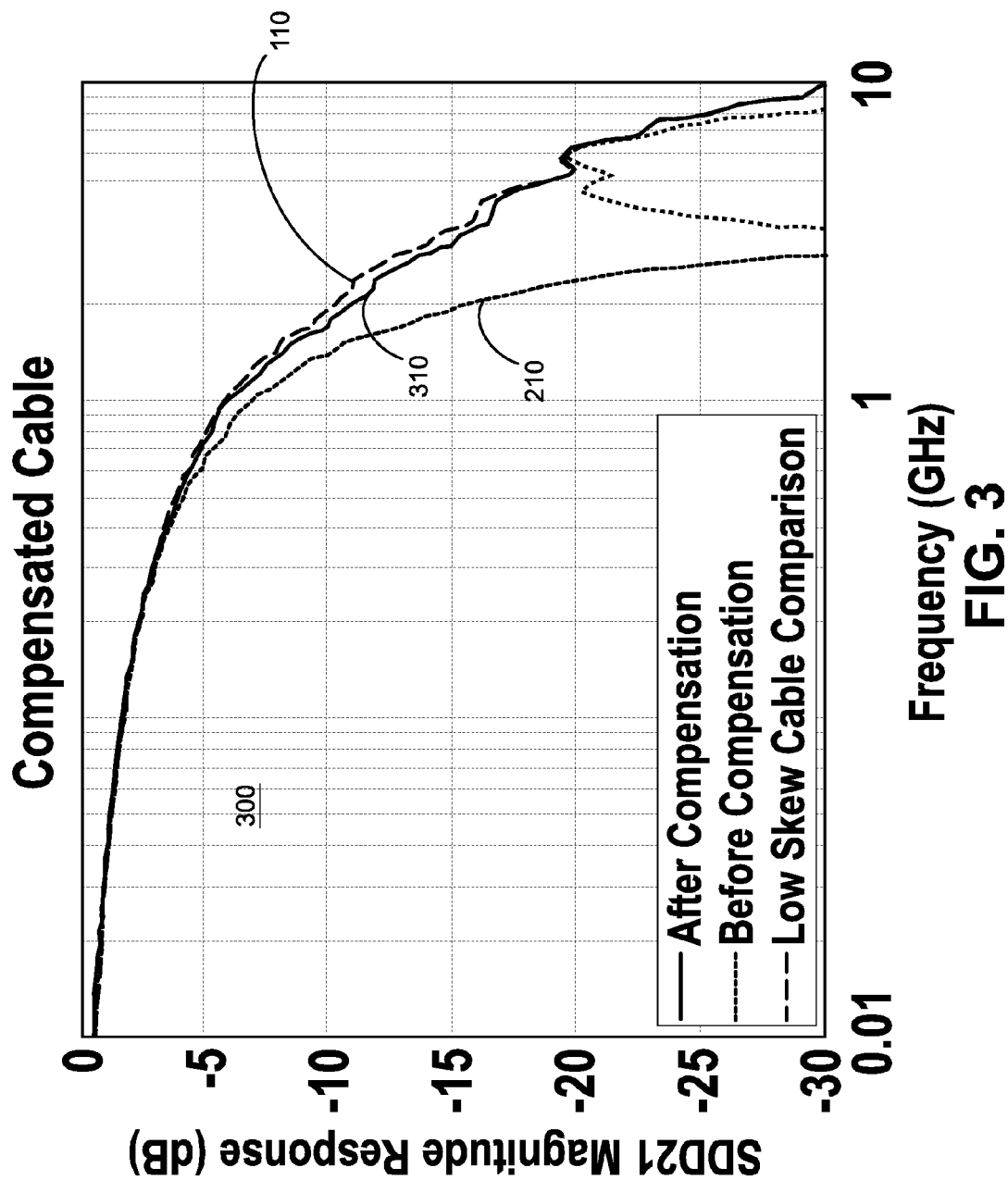
FIG. 3 illustrates a plot of the compensated SDD21 response of the bad cable from FIG. 2 and shows how, in accordance with certain exemplary embodiments of the present technology, the compensated response more closely resembles the good cable response in FIG. 1.

Certain embodiments of the present technology support processing the voltages received at the far end of a differential transmission line to reverse the mode conversion caused by defects in that transmission line. FIG. 3 illustrates an exemplary result (simulated) from applying such correction to an affected line of the 'bad' cable illustrated in FIG. 2 which is discussed above. Accordingly, performance of the 'bad' cable of FIG. 2 can be improved to support signal integrity results in keeping with the 'good' cable of FIG. 1 as evidenced by the restoration of the 'bad' channel's SDD21 210 to produce the compensated SDD21 310 which closely resembles the 'good' channel's SDD21 110. Exemplary steps can include: separately detecting the common mode and differential mode voltages received from the transmission line; and summing a controlled fraction of that common mode voltage onto the differential voltage to make a corrected voltage.

Consider the voltages received from two wires of a differential transmission line. Call them $x_p$ and $x_m$. A typical conventional differential receiver extracts the desired differential signal Vout=$x_p$−$x_m$ and intentionally disregards the common mode signal ($x_p$+$x_m$)/2. However, certain embodiments of a receiver incorporating the present technology can extract both $x_p$−$x_m$ and $x_p$+$x_m$ and then combine them (typically, but not necessarily linearly) to give the desired mode converted output Vout.

Straightforwardly, one exemplary embodiment of the present technology can compute Vout as:

$$Vout=(x_p-x_m)+a(x_p+x_m) \quad (1)$$

where a is a parameter that controls the degree of mode conversion compensation. The exemplary mode conversion compensation system 400 illustrated in FIG. 4 in functional block diagram form implements equation (1). A balanced pair of resistors 401*a* and 401*b* bridge the received differential signal composed of $x_p$ and $x_m$ to produce the common mode signal at node 402. This common mode signal is then converted into a differential representation 421*a*,421*b* by a single-to-differential convertor 410 and scaled by one or more amplifiers 420 whose gain controls the degree of mode conversion compensation. The scaled differential representation 421*a*,421*b* of the common mode signal is then injected into the received differential signal by summation nodes 430*a*,430*b* to produce the compensated differential outputs 440*a*,440*b*.

The illustrated single-ended-to-differential signal converter 410 and adjustable gain amplifiers 420 may have significant phase shift and attenuation at a high data rate (10 Gb/s), so that the differential signal and processed common mode signal may be mis-aligned in time when they are summed at the nodes 430. Matching delays can be inserted in the differential path, but with an increase in power consumption.

Certain embodiments of the present technology are based on re-ordering equation (1) above as:

$$\frac{Vout}{2} = \frac{(1+a)x_p}{2} - \frac{(1-a)x_m}{2} \quad (2)$$

Figure 5:
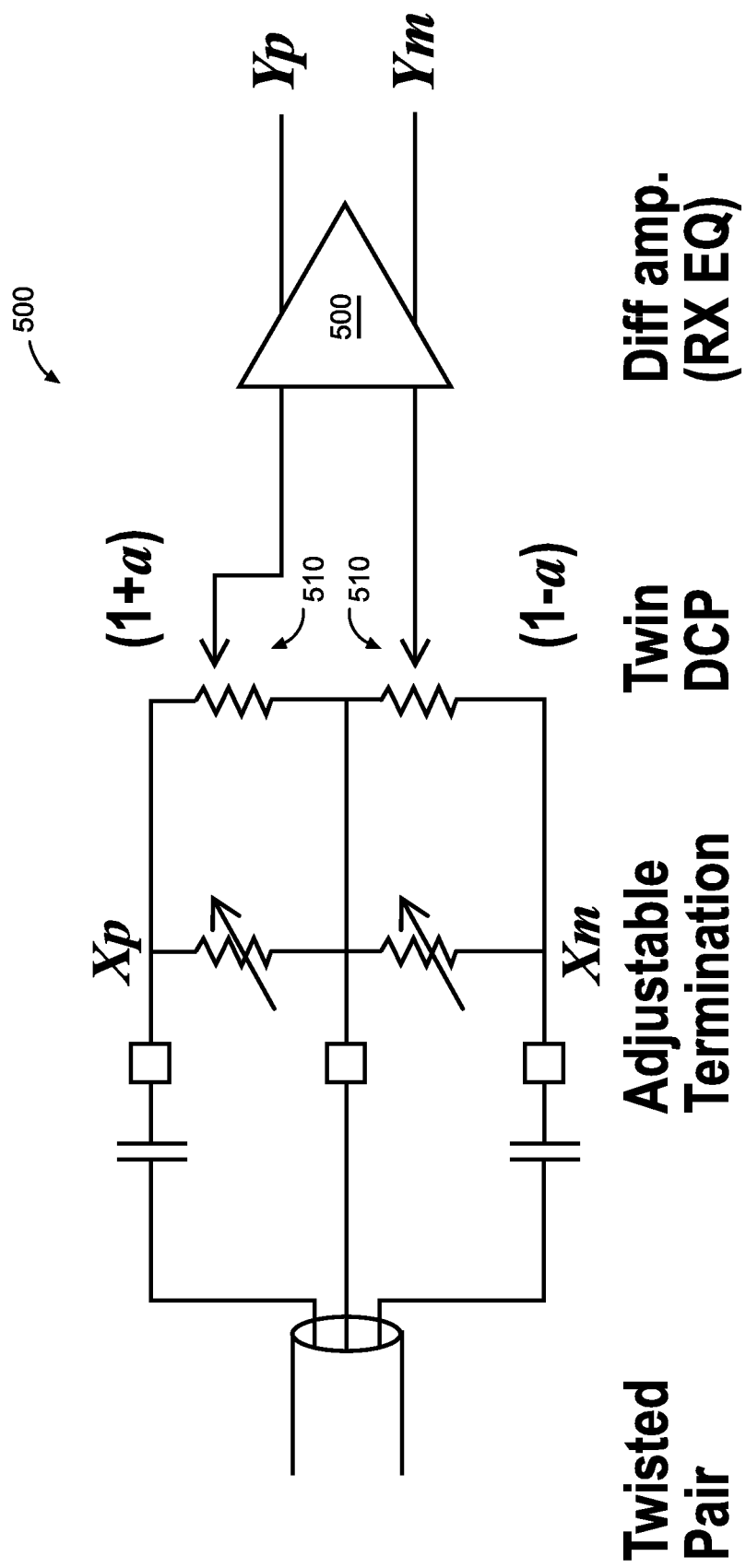
FIG. 5 illustrates a receiver-side implementation of the mode conversion and skew compensator with variable resistors in accordance with certain exemplary embodiments of the present technology.
Figure 6:
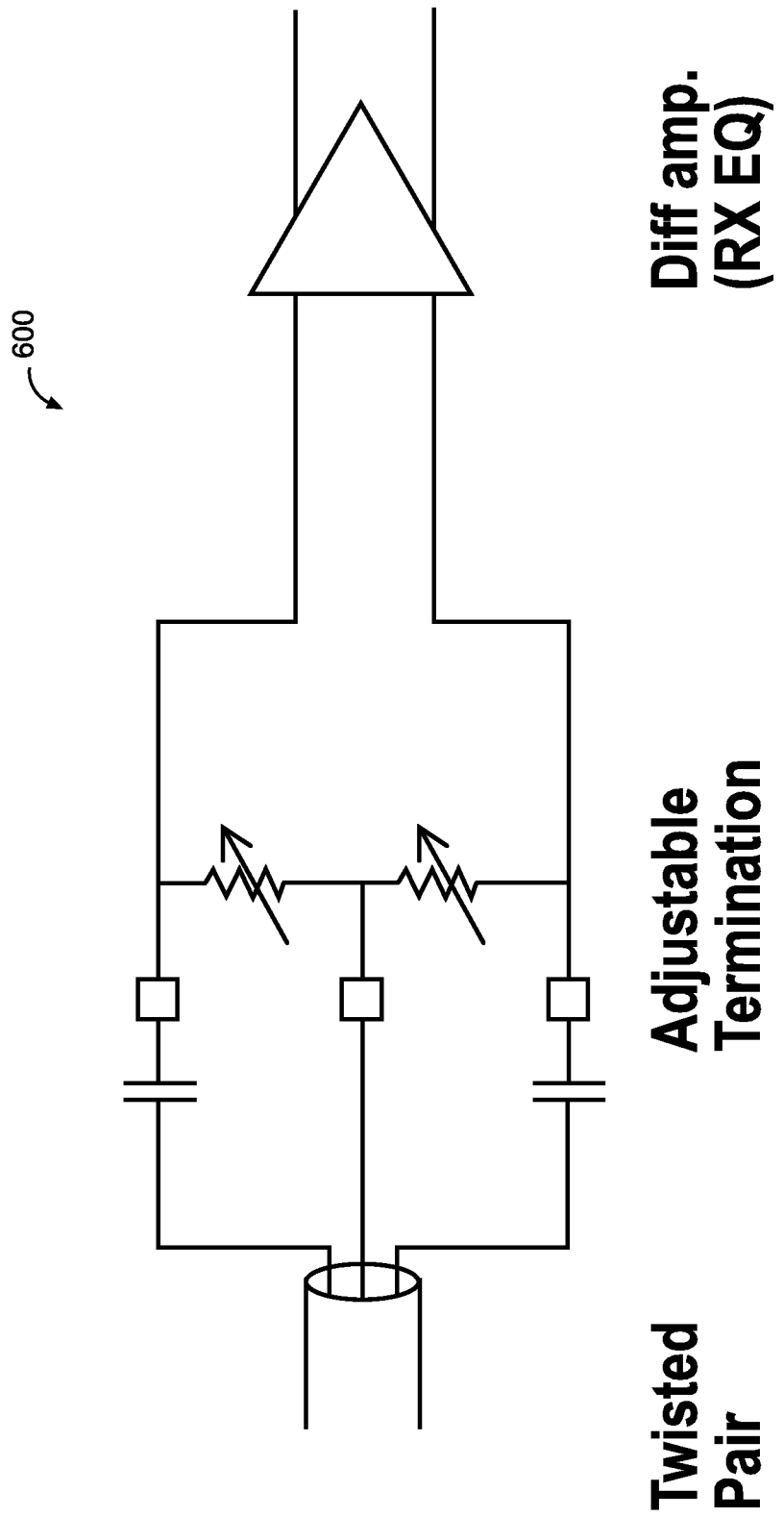
FIG. 6 illustrates a conventional differential receiver for comparison.

As illustrated in the exemplary mode conversion compensation system 500 of FIG. 5, equation (2) can be implemented by two voltage dividers 510 and a differential amplifier 520 for a in the range of −1≤a≤1. Without limiting the scope of the present technology, the mode conversion compensation system 500 utilizes digitally controlled potentiometers (DCP) for the voltage dividers 510. The mode conversion compensation system 500 can be realized by the addition of two DCP blocks to the conventional differential receiver 600 of FIG. 6. DCP circuits can utilize resistors and MOS switches, and thus can operate effectively without consuming active power.

The restriction of −1≤a≤1 bounds the correction range between two extreme cases where signal is taken from only one of the two conductors of the differential signal path. This includes the cases where the common mode voltage does not exceed the differential mode voltage, and excludes cases where the common mode voltage exceeds the differential mode voltage.

Figure 8:
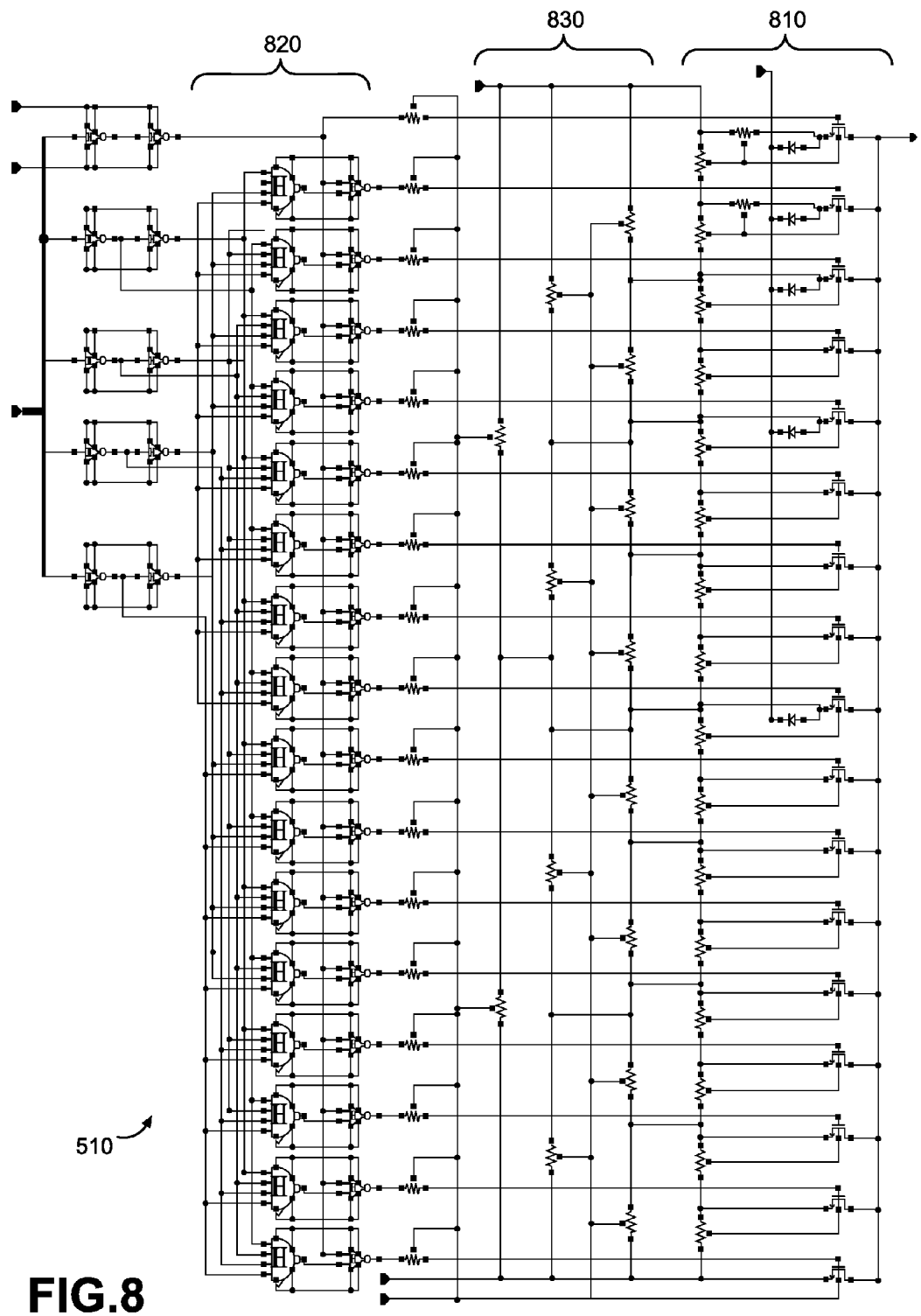
FIG. 8 illustrates a digitally controlled potentiometer schematic in accordance with certain exemplary embodiments of the present technology.

FIG. 8 is a schematic of the voltage divider 510 implemented as a DCP. The resistor string and switch array configuration 810 on the right hand side can be based on conventional circuitry, as is the decoding logic 820 on the left hand side. The resistor network 830 in between extends the frequency response of the DCP by lowering its overall resistance, without the use of small value resistances that may be poorly defined in this semiconductor technology.

Figure 7A:
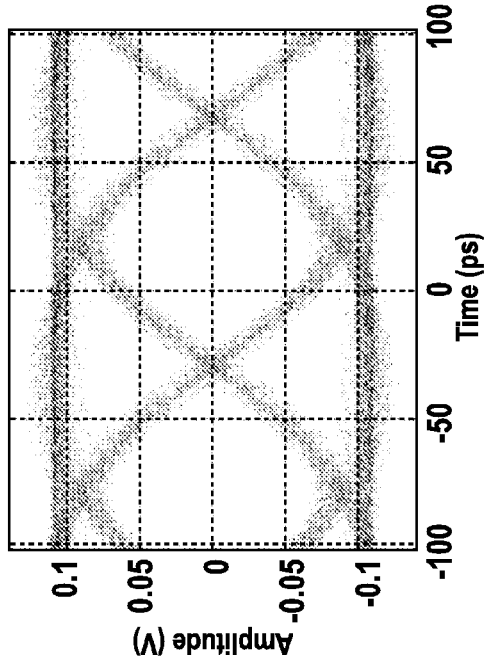
FIG. 7A illustrates an eye-diagram of a simulated 10 Gbaud binary signal communicated over the good cable of FIG. 1 and equalized with a conventional equalizer.
Figure 7C:
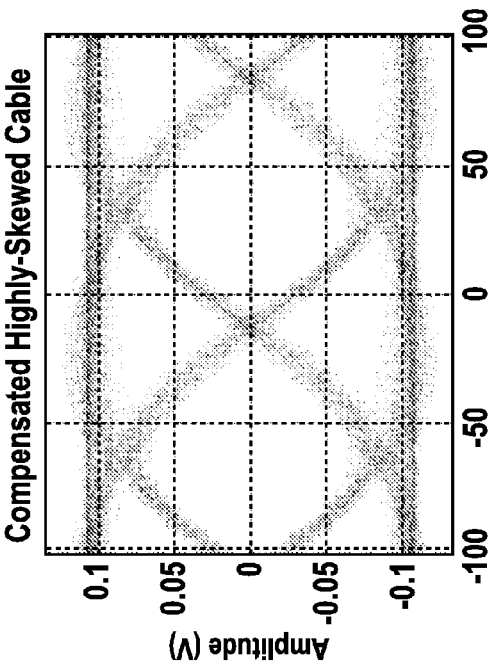
FIG. 7C illustrates an eye-diagram of a simulated 10 Gbaud binary signal communicated over the 'bad' cable of FIG. 2, processed in accordance with certain exemplary embodiments of the present technology, and equalized with a conventional equalizer.
Figure 7B:
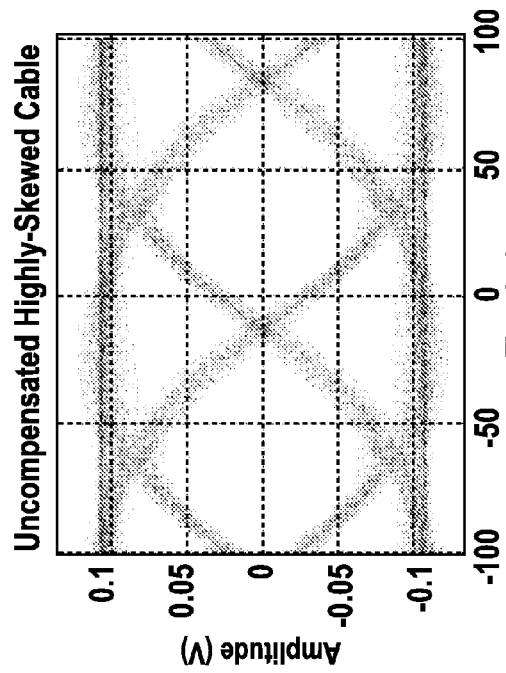
FIG. 7B illustrates an eye-diagram of a simulated 10 Gbaud binary signal communicated over the 'bad' cable of FIG. 2 and equalized with a conventional equalizer.

FIG. 7 shows eye diagrams from a simulation demonstrating the significant improvement afforded an exemplary embodiment of the present technology. FIG. 7A shows the eye diagram resulting from transmitting a 10 Gbaud differential signal over the 'good' cable of FIG. 1 and filtering it with a tuned CTLE. The open eye diagram is well known in the art as a desired characteristic indicating good signal integrity. FIG. 7B shows the eye diagram resulting from transmitting the same a 10 Gbaud differential signal but now over the 'bad' skewed cable of FIG. 2 and filtering it with a tuned CTLE. Even though the CTLE is optimized, it cannot produce an open eye because of the severe SDD21 loss 210 previously shown in FIG. 2. However, taking the same received signal over the 'bad' cable as in FIG. 7B, but now applying the proposed compensation technology covered by exemplary embodiment of the present technology in combination with a CTLE produces the open eye diagram in FIG. 7C showing significantly better signal integrity than the uncompensated 'bad' cable in FIG. 7B and almost indistinguishable from the 'good' cable in FIG. 7A.

Certain embodiments of the technology can include one or more of the following (denoted a., b., c., and d. towards enhancing readership and without implying any limitations):

a. Frequency Dependent Mode Conversion.

Figure 4:
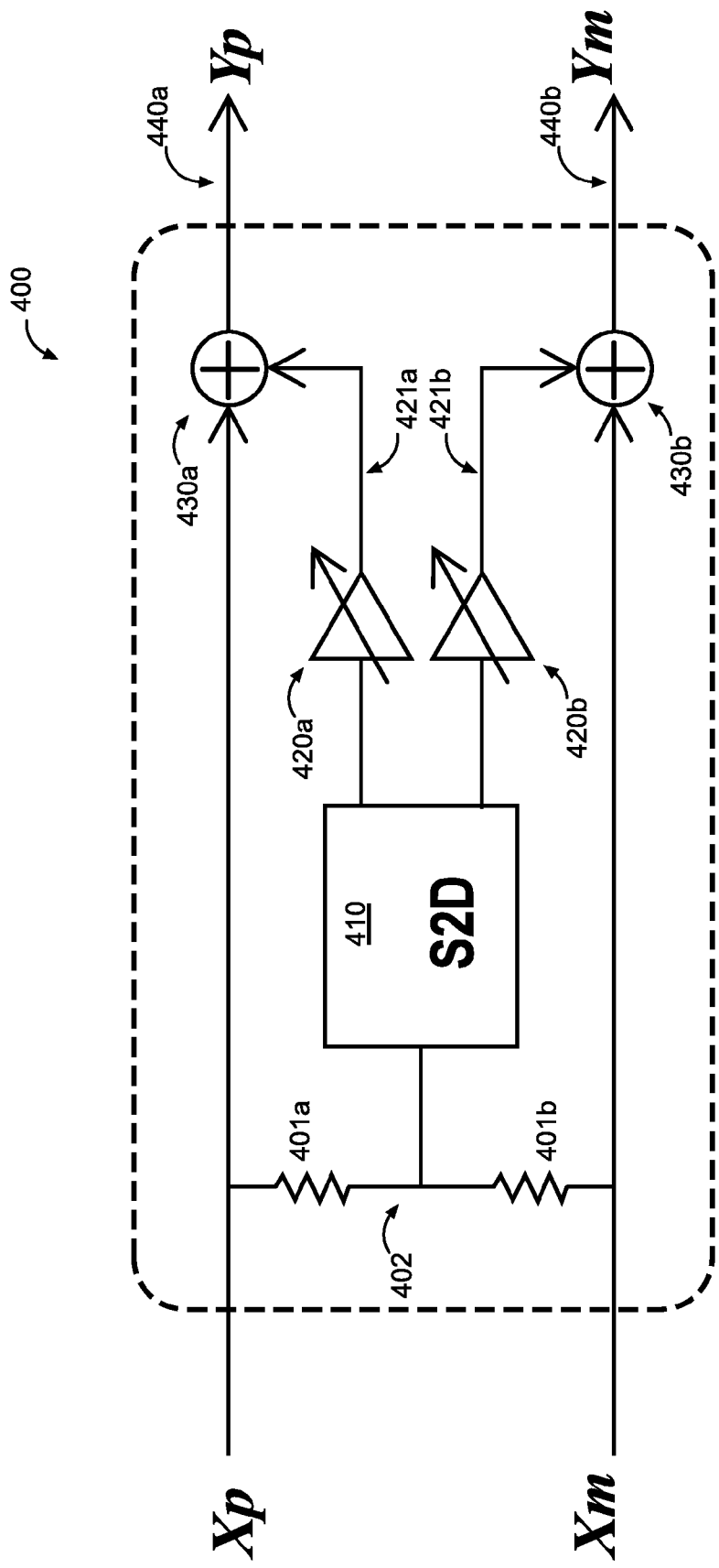
FIG. 4 illustrates a mode conversion and skew compensator in accordance with certain exemplary embodiments of the present technology.
Figure 9:
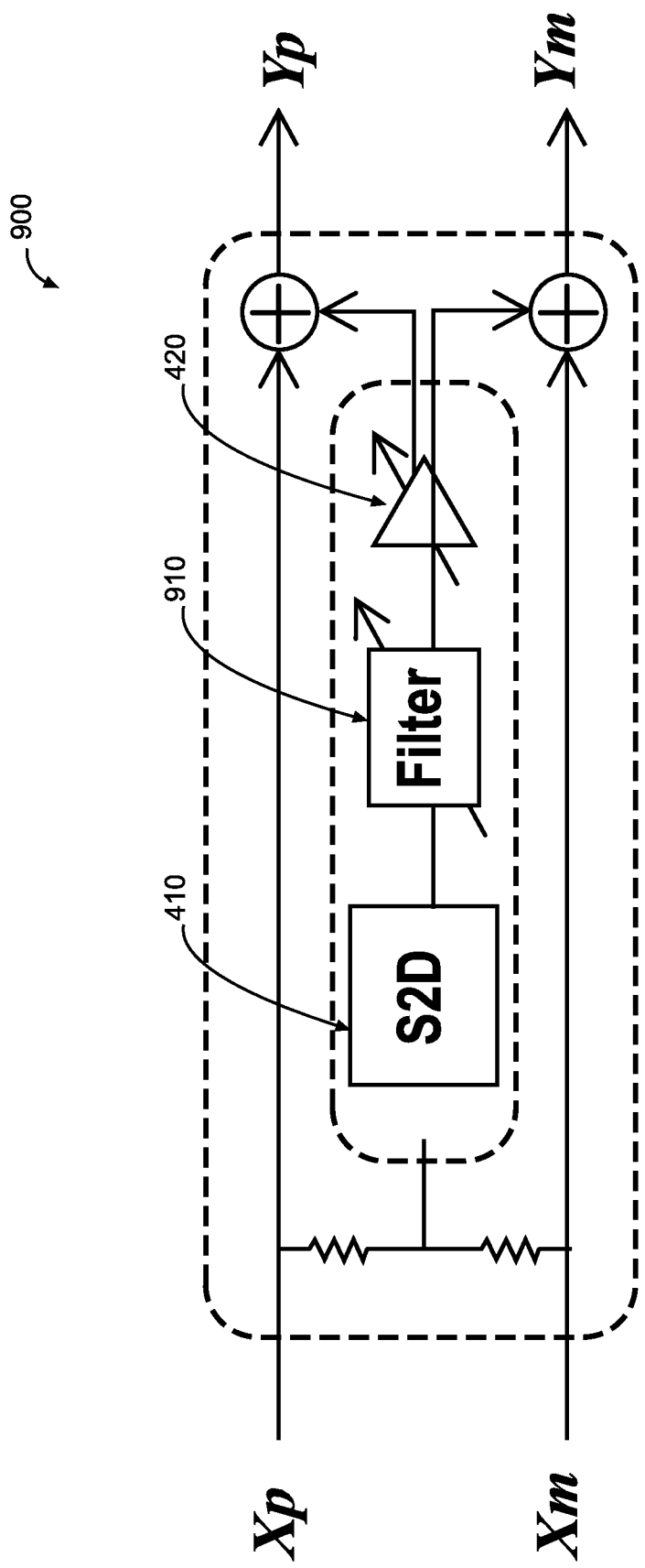
FIG. 9 illustrates a mode conversion and skew compensator addressing frequency dependent mode conversion in accordance with certain exemplary embodiments of the present technology.

In the exemplary mode conversion compensation system 900 of FIG. 9, a filter block 910 is added relative to the embodiment of FIG. 4, so that the recovered common mode voltage is modified in amplitude and/or phase as a function of frequency before being summed into the differential signal path. This examples of this filtering function include a finite impulse response (FIR) filter, an infinite impulse response (IIR) filter, a time delay, or some signal processing element that serves to (i) isolate one or more frequency bands, (ii) apply a frequency dependent gain, and/or (iii) apply a frequency dependent phase adjustment.

b. Extended Range Passive Mode Conversion.

Figure 10:
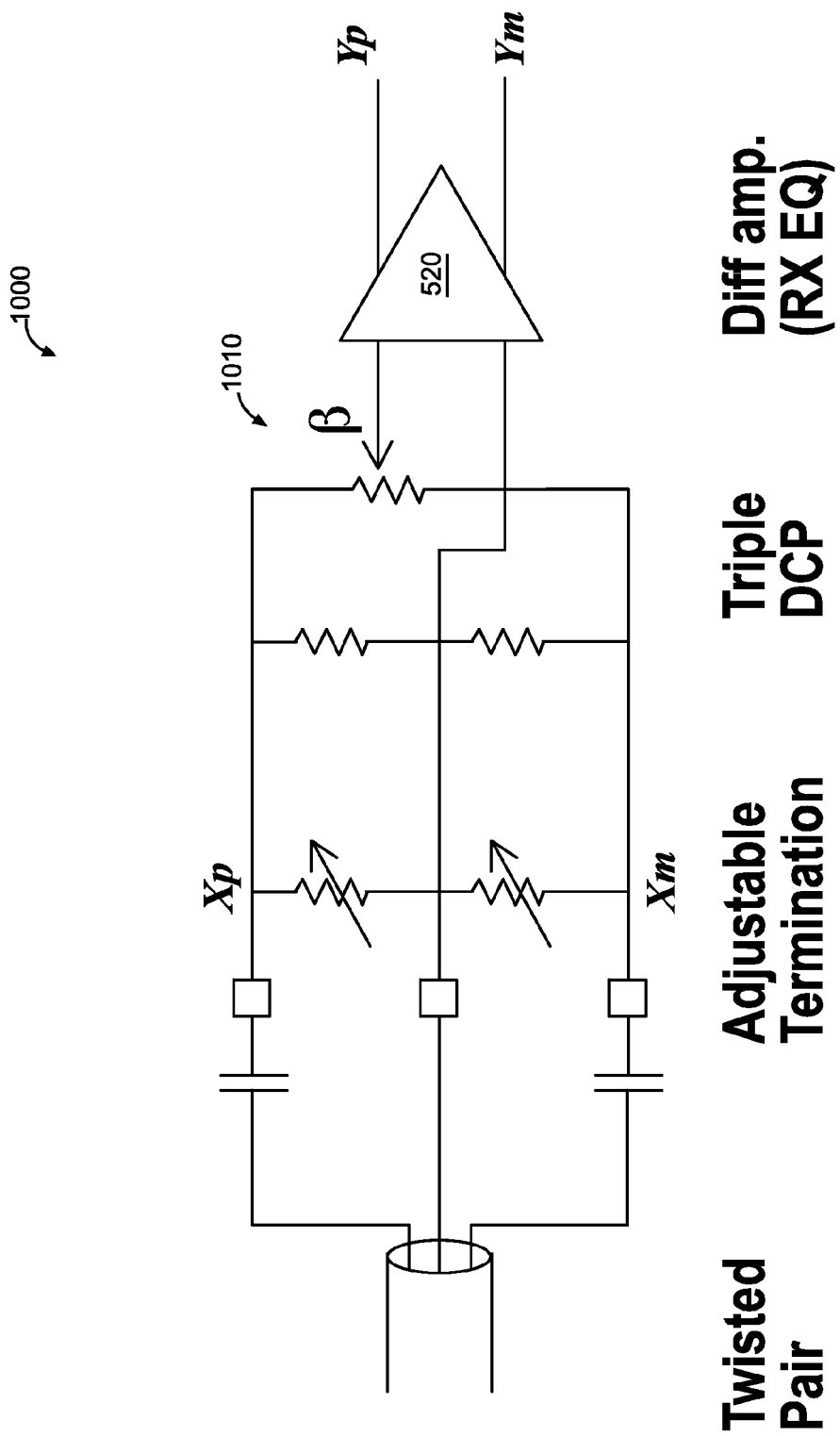
FIG. 10 illustrates a mode conversion and skew compensator supporting extended range passive mode conversion in accordance with certain exemplary embodiments of the present technology.

In the exemplary mode conversion compensation system 1000 of FIG. 10, the aforementioned restriction −1≤a≤1 on the range of the compensation factor a is removed by adding a third DCP 1010 which spans the two input voltages $x_p$ and $x_m$. When one input of the differential amplifier 520 is connected to signal ground and the other to a DCP tap on this third DCP 1010, the inverse mode conversion space includes cases where the common mode voltage is larger than the differential mode voltage, including the pure common mode case as represented by the equation $$V_{out} = \beta x_p + (1-\beta) x_m \quad (3)$$

c. Application at Either a Transmitter or Receiver.

The corrective mode conversion could be applied at either the transmit end or the receive end of the channel. One embodiment implements the present technology at the receiver to simplify controllability/adaptivity to a channel with unknown skew. However, one may also similarly apply the corrective mode conversion in a transmitter.

d. Alternate Passive Embodiments.

The passive embodiments illustrated in FIGS. 5, 8, and 10 use resistors and switches in order to achieve a broadband corrective mode conversion. Other passive elements and configurations of these elements may be used to either achieve the same function or to create a frequency dependency in the corrective mode conversion.

One exemplary embodiment of the present technology can comprise a method for improving integrity of a differential signal. The differential signal can comprise a first signal carried over a first conductor and a second signal simultaneously carried over a second conductor extending adjacent the first conductor. Such a method can comprise processing the first signal and the second signal with a circuit to generate a third and fourth signal which are both linear combinations of the first and second signals. In certain embodiments, processing the first signal and the second signal comprises the steps of: detecting common mode voltage; and detecting differential mode voltage. In certain embodiments, processing the first signal and the second signal further comprises making a voltage correction by injecting a controlled fraction of the common mode voltage onto the differential mode voltage. In certain embodiments, taking the linear combination of the first and second signals comprises summing a result of scaling the first and second signals. In certain embodiments, scaling the first and second signals comprises frequency dependent filtering of at least one of the first signal and the second signal. In certain embodiments, processing the first signal and the second signal comprises compensating for skew between the first signal and the second signal by applying corrective skew to the differential signal. In certain embodiments, processing the first signal and the second signal comprises compensating for mode conversion by applying corrective mode conversion to the differential signal. In certain embodiments, changing the first signal relative to the second signal comprises correcting a frequency dependent amplitude variation between the first signal and the second signal by adjusting an amplitude of the first signal relative to the second signal in a frequency band of the frequency dependent amplitude variation. In certain embodiments, changing the first signal relative to the second signal comprises applying a frequency dependent phase adjustment to the first signal or the second signal. In certain embodiments, changing the first signal relative to the second signal comprises causing a phase shift between the first signal and the second signal.

One exemplary embodiment of the present technology can comprise a system for processing a signal exhibiting mode conversion associated with propagation over an imperfect transmission channel, the signal comprising a common mode voltage and a differential mode voltage that are based on two voltages modulated in opposition to one another. Such a system can comprise: a pair of input ports operative to receive the two modulated voltages; a pair of output ports operative to output compensated versions of the two modulated voltages; and a circuit extending between the pair of input ports and the pair of output ports and operative to form the compensated versions of the first and second voltages, wherein the circuit comprises a pair of nodes operative to sum a controlled fraction of the common mode voltage onto the differential mode voltage to compensate for the mode conversion. In certain embodiments, the system further comprises a cable with electrical conductors connected to the pair of input ports, wherein the cable comprises the imperfect transmission channel. In certain embodiments, the mode conversion comprises skew between the two modulated voltages, and summing the controlled fraction of the common mode voltage onto the differential voltage comprises reducing the skew. In certain embodiments, the mode conversion comprises a phase shift between the two modulated voltages, and summing the controlled fraction of the common mode voltage onto the differential voltage comprises reducing the phase shift. In certain embodiments, the mode conversion comprises a frequency dependent deviation between the two modulated voltages, and summing the controlled fraction of the common mode voltage onto the differential voltage comprises correcting the frequency dependent deviation. In certain embodiments, the circuit is operative to apply to the signal another mode conversion that is reverse of the mode conversion. In certain embodiments, the circuit comprises a digitally controlled potentiometer for forming the controlled fraction. In certain embodiments, the circuit comprises a differential amplifier comprising input lines electrically coupled to the nodes and output lines electrically coupled to the output ports.

One exemplary embodiment of the present technology can comprise a circuit that comprises: a pair of input lines; a pair of output lines; at least one detector, electrically coupled to the pair of input lines, operative to detect common mode voltage and differential mode voltage for a differential signal impaired by mode conversion; and at least one node, electrically coupled between the at least one detector and the pair of output lines, operative to compensate for the mode conversion by applying a processed form of the common mode voltage to the differential mode voltage. In certain embodiments, applying the processed form of the common mode voltage to the differential mode voltage comprises reversing skew. In certain embodiments, applying the processed form of the common mode voltage onto the differential mode voltage comprises correcting a frequency domain notch in the differential mode voltage.

The exemplary methods and acts described in the embodiments presented herein are illustrative, and, in alternative embodiments, certain acts can be performed in a different order, in parallel with one another, omitted entirely, and/or combined between different exemplary embodiments, and/or certain additional acts can be performed, without departing from the scope and spirit of the invention. Accordingly, such alternative embodiments are included in the invention described herein.

Although specific embodiments of the invention have been described above in detail, the description is merely for purposes of illustration. It should be appreciated, therefore, that many aspects of the invention were described above by way of example only and are not intended as required or essential elements of the invention unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the invention defined in claim(s), the scope of which is to be accorded the broadest interpretation so as to encompass such modifications and equivalent structures.

What is claimed is:

1. A method for improving integrity of a differential signal that comprises a first signal carried over a first conductor and a second signal simultaneously carried over a second conductor extending adjacent the first conductor, the method comprising:
   processing the first signal and the second signal with a circuit that outputs a third and fourth signal each of which comprises a linear combination of the first and second signals,
   wherein processing the first signal and the second signal comprises compensating for mode conversion by applying corrective mode conversion to the differential signal.

2. The method of claim 1, wherein processing the first signal and the second signal comprises the steps of:
   detecting common mode voltage; and
   detecting differential mode voltage.

3. The method of claim 2, wherein frequency dependent filtering is applied to the detected common mode voltage.

4. The method of claim 2, wherein frequency dependent filtering is applied to the detected differential mode voltage.

5. The method of claim 1, wherein processing the first signal and the second signal comprises compensating for skew between the first signal and the second signal by applying corrective skew to the differential signal.

6. The method of claim 1, wherein processing the first and second signal comprises causing a phase shift between the first signal and the second signal.

7. A method for improving integrity of a differential signal that comprises a first signal carried over a first conductor and a second signal simultaneously carried over a second conductor extending adjacent the first conductor, the method comprising:
   processing the first signal and the second signal with a circuit that outputs a third and fourth signal each of which comprises a linear combination of the first and second signals,
   wherein processing the first signal and the second signal comprises the steps of:
   detecting common mode voltage;
   detecting differential mode voltage; and
   making a voltage correction by applying a controlled fraction of the common mode voltage onto the differential mode voltage.

8. A method for improving integrity of a differential signal that comprises a first signal carried over a first conductor and a second signal simultaneously carried over a second conductor extending adjacent the first conductor, the method comprising:
   processing the first signal and the second signal with a circuit that outputs a third and fourth signal each of which comprises a linear combination of the first and second signals,
   wherein the linear combination of the first and second signals comprises a sum of a first scaling of the first signal and a second scaling of the second signal, where the first scaling and the second scaling are either different or the same.

9. The method of claim 8, wherein the scaling of the first and second signals comprises frequency dependent filtering of at least one of the first signal and the second signal.

10. A method for improving integrity of a differential signal that comprises a first signal carried over a first conductor and a second signal simultaneously carried over a second conductor extending adjacent the first conductor, the method comprising:
   processing the first signal and the second signal with a circuit that outputs a third and fourth signal each of which comprises a linear combination of the first and second signals, wherein processing the first and second signal comprises correcting a frequency dependent loss between the first signal and the second signal by adjusting a scaling in the linear combination to reduce the loss variation across frequency.

11. A system, for processing a signal exhibiting mode conversion associated with propagation over an imperfect transmission channel, the signal comprising a common mode voltage and a differential mode voltage that are based on two voltages modulated in opposition to one another, the system comprising:
- a pair of input ports operative to receive the two modulated voltages;
- a pair of output ports operative to output compensated versions of the two modulated voltages; and
- a circuit extending between the pair of input ports and the pair of output ports and operative to form the compensated versions of the two modulated voltages,
- the circuit comprising a pair of nodes operative to sum a controlled fraction of the common mode voltage onto the differential mode voltage to compensate for the mode conversion.

12. The system of claim 11, wherein the system further comprises a cable with electrical conductors connected to the pair of input ports, wherein the cable comprises the imperfect transmission channel.

13. The system of claim 11, wherein the mode conversion comprises skew between the two modulated voltages, and
wherein summing the controlled fraction of the common mode voltage onto the differential voltage comprises reducing the skew.

14. The system of claim 11, wherein the mode conversion comprises a phase shift between the two modulated voltages, and
wherein summing the controlled fraction of the common mode voltage onto the differential voltage comprises reducing the phase shift.

15. The system of claim 11, wherein the mode conversion results in a frequency dependent loss between the two modulated voltages, and
wherein summing the controlled fraction of the common mode voltage onto the differential voltage comprises reducing the frequency dependent loss.

16. The system of claim 11, wherein the circuit is operative to apply to the signal another mode conversion that is reverse of the mode conversion.

17. The system of claim 11, wherein the circuit further comprises a digitally controlled potentiometer for forming the controlled fraction.

18. The system of claim 11, wherein the circuit further comprises a differential amplifier comprising input lines electrically coupled to the nodes and output lines electrically coupled to the output ports.

19. A circuit comprising:
- a pair of input lines;
- a pair of output lines;
- at least one detector, electrically coupled to the pair of input lines, operative to detect common mode voltage and differential mode voltage for a differential signal comprising mode conversion; and
- at least one node, electrically coupled between the at least one detector and the pair of output lines, operative to compensate for the mode conversion by applying a processed form of the common mode voltage to the differential mode voltage.

20. The circuit of claim 19, wherein applying the processed form of the common mode voltage to the differential mode voltage comprises reducing skew.

* * * * *